(12) United States Patent
Sun et al.

(10) Patent No.: US 11,315,858 B1
(45) Date of Patent: Apr. 26, 2022

(54) CHIP PACKAGE ASSEMBLY WITH ENHANCED SOLDER RESIST CRACK RESISTANCE

(71) Applicant: XILINX, INC., San Jose, CA (US)

(72) Inventors: Yu Hsiang Sun, Hsin Chu (TW);
Suresh Ramalingam, Fremont, CA (US); Tien-Yu Lee, San Jose, CA (US); Jaspreet Singh Gandhi, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/903,376

(22) Filed: Jun. 17, 2020

(51) Int. Cl.
*H01L 23/498* (2006.01)
*H01L 23/00* (2006.01)

(52) U.S. Cl.
CPC ........ *H01L 23/49811* (2013.01); *H01L 24/16* (2013.01); *H01L 24/17* (2013.01); *H01L 2224/16227* (2013.01); *H01L 2224/17132* (2013.01)

(58) Field of Classification Search
CPC ... H01L 23/49811; H01L 24/16; H01L 24/17; H01L 2224/16227; H01L 2224/17132
See application file for complete search history.

(56) References Cited

U.S. PATENT DOCUMENTS

| | | | |
|---|---|---|---|
| 2017/0084544 A1* | 3/2017 | Chen | H01L 23/3171 |
| 2019/0088621 A1* | 3/2019 | Yang | H01L 24/11 |
| 2020/0227384 A1* | 7/2020 | Lift | H01L 23/49811 |
| 2021/0043532 A1* | 2/2021 | Yuan | H01L 24/20 |
| 2021/0050300 A1* | 2/2021 | Lin | H03K 19/17736 |

* cited by examiner

*Primary Examiner* — Douglas W Owens
(74) *Attorney, Agent, or Firm* — Patterson + Sheridan, LLP (57) ABSTRACT

A chip package assembly having robust solder connections are described herein. In one example, a chip package assembly is provided that includes an integrated circuit (IC) die and a package substrate. Solder pads are arranged to connect to pillars of the IC die via solder connections. Solder resist in the corners of the package substrate and surrounding the solder connections may be inhibited from cracking isolating the portion of the solder resist surrounding the solder pads and/or by providing an offset between centerlines of the pillars and solder pads.

20 Claims, 7 Drawing Sheets

CHIP PACKAGE ASSEMBLY WITH ENHANCED SOLDER RESIST CRACK RESISTANCE

BACKGROUND OF THE INVENTION

Field of the Invention

Implementations described herein generally relate to chip packaging, and in particular, structures and techniques for improving solder resist crack resistance proximate solder connections.

Description of the Related Art

An increasing demand for electronic equipment that is smaller, lighter, and more compact has resulted in a concomitant demand for semiconductor packages that have smaller outlines and mounting areas or "footprints." One response to this demand has been the development of the "flip-chip" method of attachment and connection of semiconductor chips or "dice" to substrates (e.g., PCBs or lead-frames). Flip-chip mounting involves the formation of bumped contacts (e.g., solder balls) on the active surface of the die, then inverting or "flipping" the die upside down and reflowing the bumped contacts (i.e., heating the bumped contacts to the melting point) to form solder joints fusing the bumped contacts to the corresponding pads on the substrate.

In flip-chip mounting and connection methods, reliability of solder connections is becoming an increasing concern of the electronics industry. Notably, the reliability of the integrated circuit interconnects, e.g., solder joints, is one of the most critical issues for successful application of such mounting and connection methods. One challenge is that the solder resist surrounding solder joints is susceptible to cracking, which during reflow of the solder joint, may permit the wicking of solder away from the solder joint, which may lead to cracking, poor performance and even failure of the solder joint. Moreover, solder wicking into cracks formed in the solder resist may even cause electrical shorting, and ultimately failure of the device.

Therefore, there is a need for improved integrated circuit interconnects and methods of forming improved solder joints for an integrated circuit.

SUMMARY

A chip package assembly having robust solder connections are described herein. In one example, a chip package assembly is provided that includes an integrated circuit (IC) die and a package substrate. The IC die has a plurality of pillars. Each of the plurality of pillars has a centerline. The package substrate has a plurality of solder pads. Each of the plurality of solder pads has a pad surface exposed through a layer of solder resist. The exposed pad surface has a centerline. The solder pads are arranged to connect to the pillars of the IC die via solder connections. Prior to reflow, a first offset is defined between centerlines of a first pillar of the plurality of pillars disposed proximate a first edge of the IC die and a corresponding first exposed pad surface of a first solder pad of the plurality of solder pads that is greater than a second offset defined between centerlines of a second pillar of the plurality of pillars disposed proximate a center of the IC die and a corresponding second exposed pad surface of a second solder pad of the plurality of solder pads.

In another example, a third offset is defined between centerlines of a third pillar of the plurality of pillars disposed proximate a third edge of the IC die and a corresponding third exposed pad surface of a third solder pad of the plurality of solder pads. The third offset is greater than the second offset described above.

In another example, a chip package assembly is provided that includes an integrated circuit (IC) die and a package substrate. The IC die has a plurality of pillars. The package substrate has a plurality of solder pads that are configured to connect with the plurality of pillars. The solder pads disposed in corner regions of the IC die are disposed further from a centerline of the IC die than the corresponding (i.e., mating) pillars.

In yet example, a chip package assembly is provided that includes an integrated circuit (IC) die having a plurality of pillars and a package substrate having a plurality of solder pads exposed through a solder resist. The solder pads are coupled to the pillars of the IC die via solder connections. The solder resist has a first trench circumscribing a first solder pad of plurality of solder pads.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Embodiments of the disclosed technology generally provide an improved solder interconnect for connecting an integrated circuit (IC) die to a package substrate within a chip package assembly. In particular, the techniques described herein inhibit the solder resist from cracking after shrinkage of the chip package assembly. Shrinkage chip package assembly generally occurs after exposure to high temperatures, such as experienced during reflow of the solder connection. The shrinkage causes stress on the solder connection and surrounding solder resist. Techniques mitigates the generation of such stress, resulting in a more robust and reliable solder interconnect, and consequently, a more robust and reliable chip package assembly and electronic device.

In one technique, the solder pads of the package substrate and the bumps of the IC die are offset at least in regions of the chip package that are spaced away from the center of the IC die prior to reflowing the solder connections used to mechanically and electrically couple the package substrate to the IC die. The bumps of the IC die may also be referred to herein as pillars. The offset is arranged in a direction that compensates for shrinkage of the package substrate relative to the IC die that occurs during reflow, which results in the solder connection having improved alignment as compared to traditional techniques. The improved alignment reduces the amount of stress imparted in the solder resist adjacent the solder connection, thus making the solder resist much less prone to cracking. The crack resistant solder resist in turn increases the reliability and performance of the solder connection, which also increasing the reliability, performance and service life of the chip package assembly.

The offset between the solder pads of the package substrate and the bumps of the IC die is greater and thus more apparent prior to shrinkage of the chip package assembly. The offset remains apparent even after the package substrate and the IC die have shrunk after reflow and assembly, although to a lesser extent as the offset beneficially turns a designed in misalignment between components to stress reduced, better aligned assembly after reflow.

In another technique, a trench is formed in the solder resist around one or more of the solder pads. The trench creates a small ring of solder resist immediately surrounding the solder pad or pads that effectively isolates most if not all of the stress imparted in the ring of solder resist from the main bulk of solder resist. The ring of solder resist defined by the trench is more resilient and flexible than the main bulk of solder resist, and thus has an increased resistance to cracking. Moreover, as the main bulk of solder resist is isolated from the stress imparted by the solder pad, the main bulk of solder resist essentially has a very low probability of cracking. The trench may be utilized with or without of an offset between the solder pads of the package substrate and bumps of the IC die. Regions susceptible to higher stress, such as proximate the corners and edges of the IC die, have trenches that each circumscribe fewer solder pads, while regions susceptible to lower stress, such as proximate the center of the IC die, may have trenches that each encircle more than one solder pad. For example in the corner regions, a single trench may circumscribes as few as one solder pad, while in a region closer to the center of the array of solder pads, a trench may not be utilized, or alternatively, be utilized to circumscribe two or more solder pads. Beneficially, the trenches provide stress relief within the solder resist particularly at solder pads disposed near the corners of the IC die, which makes the solder resist much less prone to cracking. As noted above, the crack resistant solder resist increases the reliability and performance of the solder connection, which also increases the reliability, performance and service life of the chip package assembly.

Figure 1:
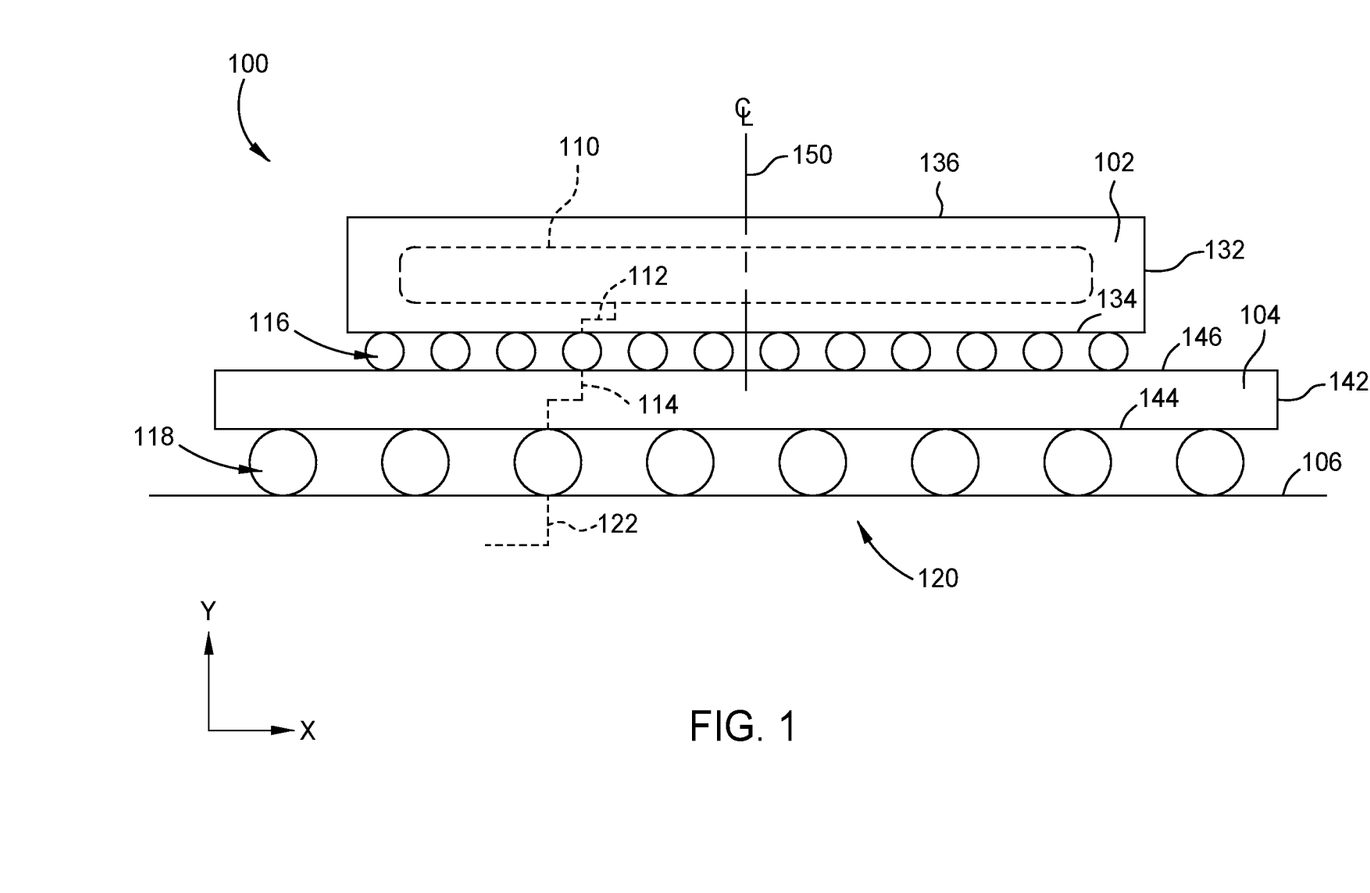
FIG. 1 is a schematic sectional view of an exemplary integrated circuit chip package assembly.

Turning now to FIG. 1, a schematic sectional view of an exemplary integrated circuit chip package assembly 100 is illustrated having crack resistant solder connections 116. The robust solder connections 116 are enabled by offsetting and/or isolating the solder bumps and solder pads comprising the connections 116 in high stress areas of the chip package assembly 100. Although the offset solder connections 116 are illustrated and described as joining an IC die and package substrate, the use of the offsetting and/or trench isolation techniques may be utilized to enhance solder connections between other components.

The chip package assembly 100 includes at least one integrated circuit (IC) die 102 mounted to a package substrate 104. Although one IC die 102 is shown mounted to the package substrate 104 in FIG. 1, one or more additional IC dies may be stacked directly on the IC die 102 and/or directly on the package substrate 104 laterally adjacent the IC die 102.

The IC die 102 may be, but are not limited to, programmable logic devices, such as field programmable gate arrays (FPGA), memory devices, such as high band-width memory (HBM), optical devices, processors, application-specific integrated circuit (ASIC), or other solid state, logic or memory structures. The IC die 102 may optionally include optical devices such as photo-detectors, lasers, optical sources, and the like.

The IC die 102 has a body that includes a top surface 136, a bottom surface 134 and sides 132. Functional circuitry 110 resides in the body of the IC die 102 and is connected to inputs and outputs residing on the bottom surface 134 of the IC die 102 by routing 112.

The package substrate 104 has a body that includes a top surface 146, a bottom surface 144 and sides 142. Routing 114 is formed though the body of the package substrate 104 is connected to inputs and outputs residing on the top and bottom surfaces 146, 144 of the package substrate 104.

The solder connections 116 mechanically and electrically secure the IC die 102 to the package substrate 104. For example, the solder connections 116 mechanically couple the top surface 146 of the package substrate 104 to the bottom surface 134 of the IC die 102, while also electrically connecting the routings 112 formed in the IC die 102 with the routings 114 formed in the package substrate 104.

The chip package assembly 100 may be mounted to a printed circuit board (PCB) 106 to form an electronic device 120. In this manner, the routing 114 of the package substrate 104 is coupled to routing of 122 the PCB 106 via solder balls 118, or other suitable connection. In the example depicted in FIG. 1, the bottom surface 144 of the package substrate 104 is electrically and mechanically coupled to a top surface of the PCB 106 by the solder balls 118.

The solder connections 116 securing the IC die 102 to the package substrate 104 are generally arranged in an array. Thus, both the IC die 102 and the package substrate 104 includes components of the solder connections 116 that are arranged in a predefined manner to ensure sufficient alignment contact that enables the electrical connection between IC die 102 and the package substrate 104 upon assembly. In one example, to inhibit cracking or other failure of the solder connections 116 within the array, certain solder connections 116 include a shift (also referred interchangeably as "offset") between the bumps and solder pads as further described below. The offset may be a little as zero at the center of the array of solder connections 116, for example, in a region along the bottom surface 134 of the IC die 102 that is proximate to a centerline 150 of the IC die. The offset of the solder connections 116 located at the side 132 and/or corner of the bottom surface 134 of the IC die 102 is greater than the offset in the region proximate to the centerline 150 of the IC die 102. The greater offset of the solder connections 116 located at the side 132 and/or corner of the bottom surface 134 of the IC die 102 enables the solder within the connections 116 to be reflowed during fabrication without generating stress to levels that conventionally induce cracks, thus forming a more robust and reliable electrical connection. The stress generated during reflow is generally induced by a mismatch in the coefficient of thermal expansion between the IC dies 102 and the package substrate 104.

Optionally, either in addition or in the alternative to using an offset in the solder connections 116, the chip package assembly 100 may utilize a trenching technique to obtain essentially the same benefits. The trenching technique is described below with reference to FIGS. 6-9.

Figure 2:
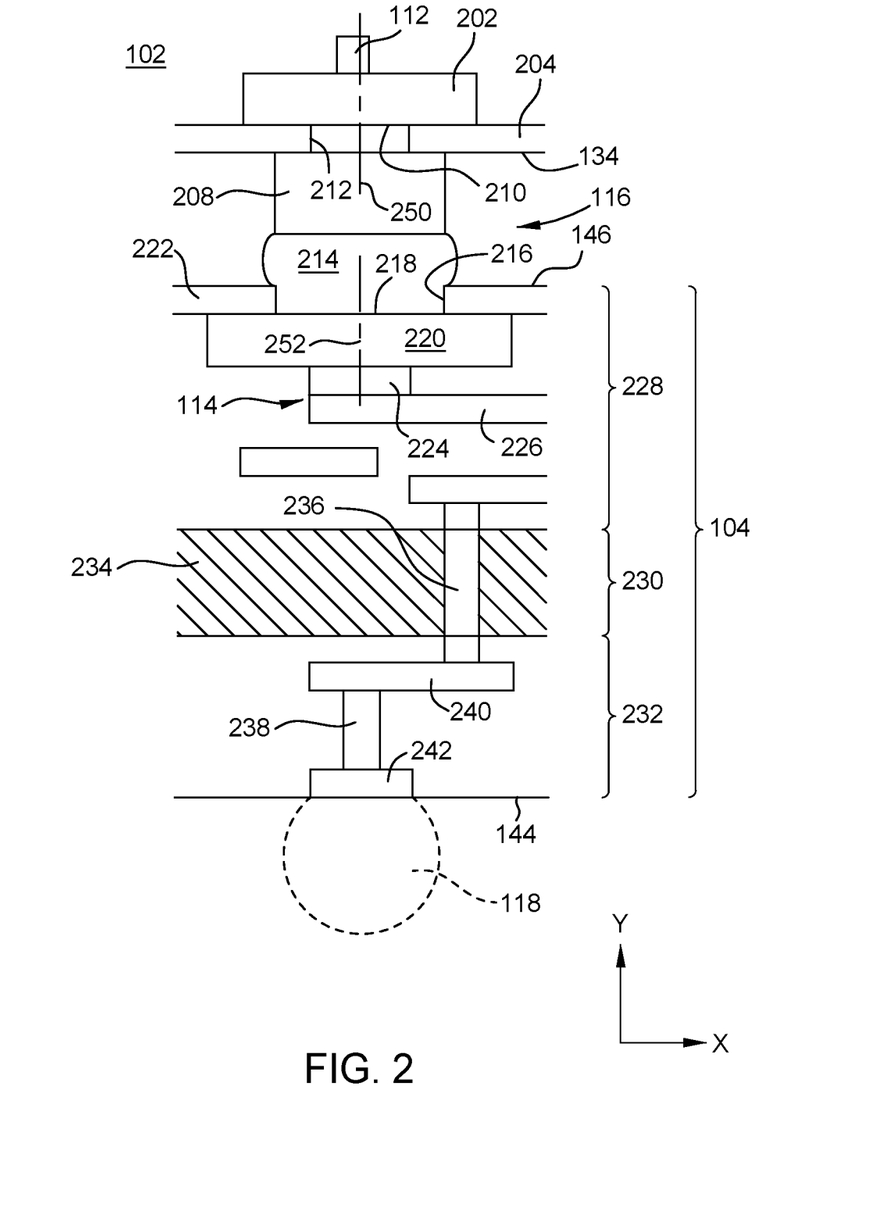
FIG. 2 is a partial sectional view of an exemplary solder connection disposed proximate the center of the chip package assembly of FIG. 1.

FIG. 2 is a partial sectional view of an exemplary solder connection 116 disposed proximate the centerline 150 of the chip package assembly 100 detailing the components of the solder connection 116. It is understood that the alternative constructions for the solder connections 116 may be utilized, and that FIG. 2 is primarily utilized to introduce the structure from which the offset within the solder connection 116 may be defined. Although little or no offset is shown in the solder connection 116 due to the location of the solder connection 116 proximate the centerline 150, the offset will be shown and described in detail in FIGS. 3-6 below.

Continuing to refer to FIG. 2, the IC die 102 includes a contact pad 202 at which certain routing 112 of the IC die 102 terminates. Although only one contact pad 202 is shown in FIG. 2, the number of contact pad 202 may be up to as many as space permits on the bottom surface 134 of the IC die 102.

The bottom surface 134 of the IC die 102 is covered by a dielectric layer 204. The dielectric layer 204 includes an opening 212 through which an exposed surface 210 of the contact pad 202 is revealed. A pillar 208, also referred to as a bump, is disposed on and makes electrical connection with the exposed surface 210 of the contact pad 202. The pillar 208 is generally formed from a conductive metal, such as copper or other suitable metal. The pillar 208 extends thought the opening 212 and beyond the dielectric layer 204 forming the bottom surface 134 of the IC die 102.

The package substrate 104 includes at least a first built-up layer 228 formed on a core 230. Optionally, a second built-up layer 232 is formed on the opposite side of the core 230.

The first built-up layer 228 extends from the core 230 and terminates to define the top surface 146 of the package substrate 104. The top surface 146 is generally defined by a layer of solder resist 222. The solder resist 222 includes an opening 212 through which an exposed surface 218 of the solder pad 220 is revealed. A solder ball 214 is disposed on and makes electrical connection with the exposed surface 218. The solder ball 214 extends thought the opening 216 and beyond the solder resist 222 forming the top surface 146 of the package substrate 104. The solder ball 214, after mounting of the IC die 102 to the package substrate 104 and reflow, makes mechanical and electrical connection between the solder pad 220 and pillar 208, thus connecting the functional circuitry of the IC die 110 with the electrical routing 114 of the package substrate 104.

The first built-up layer 228 also includes a portion of the routing 114 of the package substrate 104. In the package substrate 104, the routing 114 of the first built-up layer 228 is fabricated using conductive vias 224 and conductive lines 226. One of the conductive vias or lines 224, 226 terminate at the solder pad 220. One of the conductive vias or lines 224, 226 also terminate at feed through 236 formed through a core material 234 of the core 230. The core material 234 provides the structural rigidity to the package substrate 104, and may be fabricated from silicon, ceramic, glass reinforced plastic or other suitable material.

The optional second built-up layer 232 also includes a portion of the routing 114 of the package substrate 104. The routing 114 of the second built-up layer 232 is also fabricated using conductive vias 238 and conductive lines 240. One of the conductive vias or lines 238, 240 terminate at a contact pad 242, while one of the conductive vias or lines 238, 240 also terminates at the feed through 236 formed through the core material 234. The contact pad 242 is utilized to connect with the solder ball 118 (shown in phantom in FIG. 2).

The exposed surface 210 of the contact pad 202 has a centerline 250 that extends normally relative to the bottom surface 134 of the IC die 102 through the opening 212 formed in the dielectric layer 204. The pillar 208 is generally centered within the opening 212 on the exposed surface 210, and thus, the pillar 208 has a centerline that is collinear with the centerline 250 of the exposed surface 210. In other words, the centerline 250 of the exposed surface 210 is also the centerline 250 of the pillars 208. Similarly, the exposed surface 218 of the solder pad 220 has a centerline 252 that extends normally relative to the top surface 146 of the package substrate 104 through the opening 216 formed in the solder resist 222. The solder ball 214 is generally centered within the opening 216 on the exposed surface 218, and thus, the solder ball 214 has a centerline (not shown) that is collinear with the centerline 252 of the exposed surface 218.

As each solder connection 116 generally includes a pillar 208 that is configured to mate with a corresponding solder ball 214, the offset within a solder connection 116 is defined by the offset, i.e., the distance, between the centerlines 250, 252. In the example illustrated in FIG. 2, the offset between the centerlines 250, 252 of a solder connection 116 residing near the centerline 150 of the IC die 102 is or substantially is zero. However, the offset generally increases the further the solder connection 116 is from the centerline 150 of the IC die 102. The increase in offset may be linear, for example as a function of the distance of the solder connection 116 from the centerline 150, step wise between regions defined by their relative distance from the centerline 150, or by another suitable convention.

Figure 3:
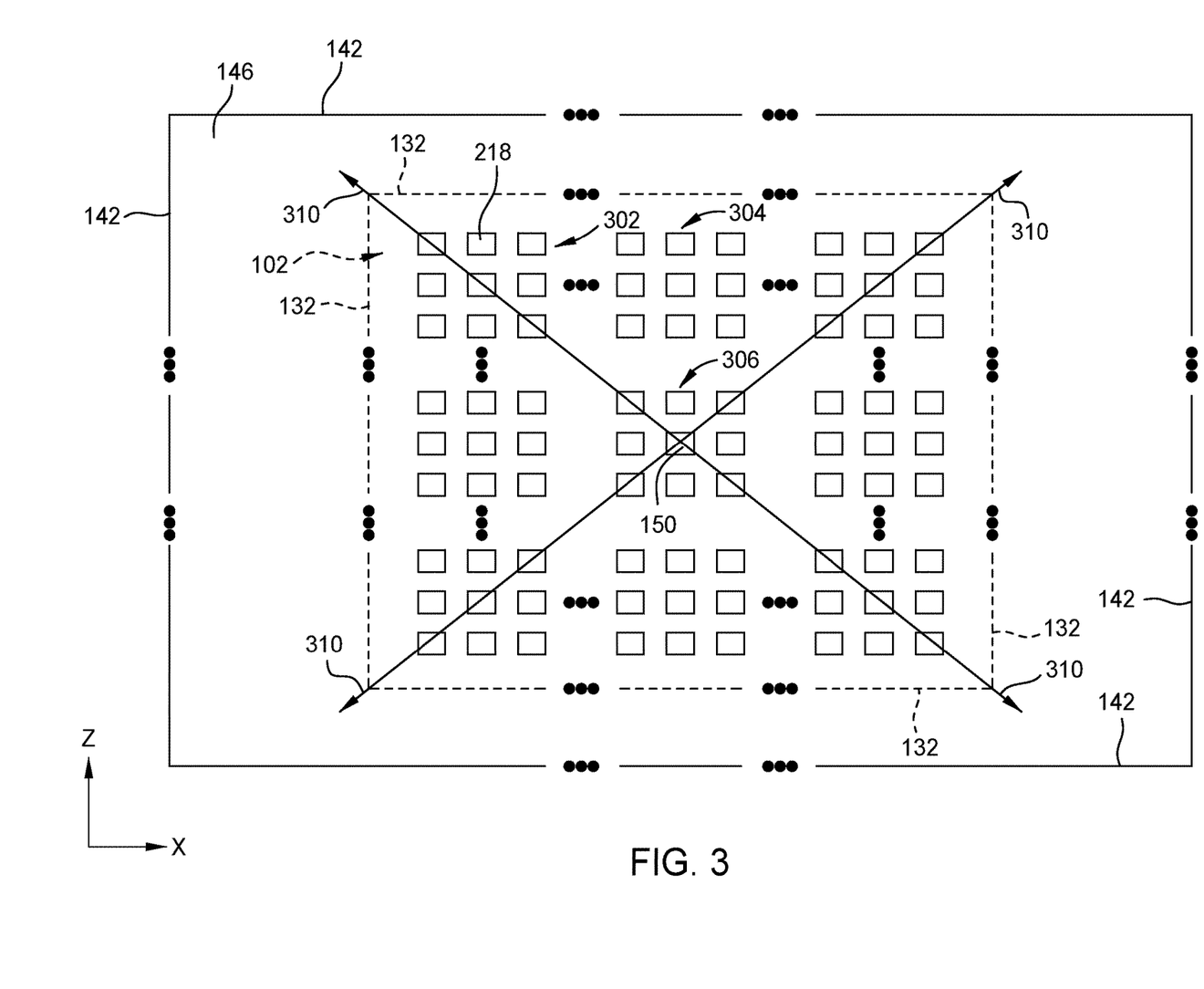
FIG. 3 is a schematic top view of an upper surface of a package substrate illustrating solder pads arranged to receive an integrated circuit (IC) die of the chip package assembly of FIG. 1.
Figure 4:
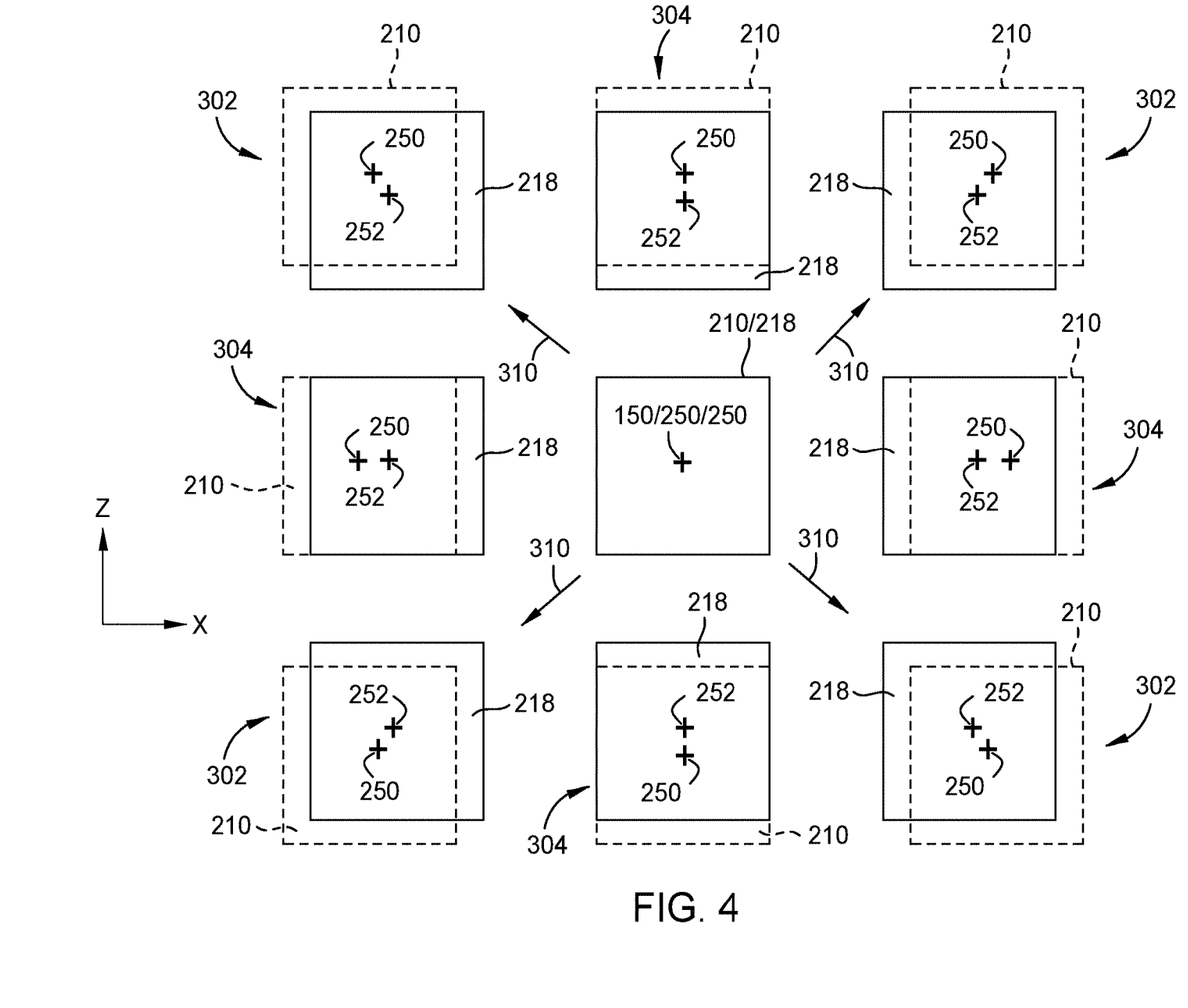
FIG. 4 is a schematic representation illustrating a distribution of relative alignment or shift between solder pads of the package substrate and pillars of the IC die across different regions of the chip package assembly.

FIGS. 3 and 4 are illustrative of a sample distributions of offsets within the solder connections 116 of the chip package assembly 100. In FIGS. 3 and 4, although the exposed surfaces 218 of the solder pads 220 and mating pillars 208 shown as square, the exposed surfaces 218 and pillars 208 may have other profiles, such as round.

Referring first to the schematic top view of the top surface 146 of the package substrate 104 illustrated in FIG. 3, the exposed surfaces 218 of the solder pads 220 are shown arranged in a predefined array that is configured to receive the mating pillars 208 extending from the bottom surface 134 of the IC die 102 of the chip package assembly 100. The IC die 102 is shown in phantom with the sides 132 of the die 102 extending beyond the array of exposed surfaces 218 of the solder pads 220 to define a die mounting area on the top surface 146 of the package substrate 104.

The array of exposed surfaces 218 of the solder pads 220 are generally arranged centered about an imaginary origination point that aligns with the centerline 150 of the IC die 102 when the IC die 102 is mounted to the package substrate 104. Stated differently, the imaginary origination point from which the relative positions of the exposed surfaces 218 of the solder pads 220 are described is on the centerline 150 as the centerline 150 projects normally from the bottom surface 134 of the IC die 102 through the top surface 146 of the package substrate 104. The exposed surfaces 218 of the solder pads 220 may be grouped relative to their location relative to the centerline 150 (e.g., origination point). A first group 302 of exposed surfaces 218 of the solder pads 220 are located proximate the corners of the IC die 102 (that is, near the intersection of two adjacent sides 132). The reference numeral 302 is interchangeably utilized to refer to the first group 302 of surfaces 218 and pads 220 and also the corner region 302 of the IC die 102 and associated array of solder connections 116 located therein. The first group 302 may include at least 3 rows and columns of the exposed surfaces 218 closest to the sides 132 of the IC die 102. The solder connections 116 made on the exposed surfaces 218 of the first group 302 had an offset greater than an offset of solder connections 116 at the center of the array of exposed surfaces 218. In one example, the solder connections 116 made on the exposed surfaces 218 of the first group 302 have the largest offset within the array of exposed surfaces 218. The offset of the solder connections the first group 302 is generally in a direction extending radially way from the centerline 150, as shown by arrows 310. Optionally, the offset of the solder connections the first group 302 may be in a direction extending way from the centerline 150 within the plane of the top surface 146 (i.e., the X or Y direction). In the example depicted in FIG. 3, the offset of the solder connections of first groups 302 disposed in opposite corners of the IC die 102 are generally in opposite directions.

A second group 304 of exposed surfaces 218 of the solder pads 220 are located along the sides 132 of the IC die 102 between adjacent first groups 302. The reference numeral 304 is interchangeably utilized to refer to the second group 304 of surfaces 218 and pads 220 and also the edge region 304 of the IC die 102 and associated array of solder connections 116 located therein. The second group 304 may include at least 3 rows or columns of the exposed surfaces 218 closest to the nearest side 132 of the IC die 102. The solder connections 116 made on the exposed surfaces 218 of the first group 302 may be offset the same amount of the offset of the solder connections 116 residing in the first group 302. Alternatively, the solder connections 116 made on the exposed surfaces 218 of the first group 302 may be offset by a smaller amount relative to the offset of the solder connections 116 residing in the first group 302. Optionally, the solder connections 116 made on the exposed surfaces 218 of the first group 302 may have substantially no offset. In the example depicted in FIG. 3, the offset of the solder connections of second groups 304 disposed in opposite sides 132 of the IC die 102 are generally in opposite directions. The solder connections 116 of FIGS. 5-6 described further below are illustrative of a solder connection 116 within the second and/or third groups 304, 306.

The third group 306 of exposed surfaces 218 of the solder pads 220 are located proximate the centerline 150 of the IC die 102, radially inward of the first and second groups 302, 304. The reference numeral 306 is interchangeably utilized to refer to the third group 306 of surfaces 218 and pads 220 and also the center region 306 of the IC die 102 and associated array of solder connections 116 located therein. The solder connection 116 of FIG. 2 described above is illustrative of a solder connection 116 within the third group 306. The third group 306 may include at least 3 rows and columns of the exposed surfaces 218 closest to the centerline 150 of the IC die 102. The solder connections 116 made on the exposed surfaces 218 of the third group 306 may be offset by an amount less that the offset of the solder connections 116 residing in the first group 302. Alternatively, the solder connections 116 made on the exposed surfaces 218 of the third group 306 may be offset by an amount less that the offset of the solder connections 116 residing in the first group 302 and second groups 304, with the offset of the first group 302 being greater than or equal to the offset of the second group 304. However, the solder connections 116 made on the exposed surfaces 218 of the third group 306 typically have little to no offset, particularly as compared to the offsets present in the first group 302.

When comparing offsets between groups 302, 304, 306, the average or representative offset for each group may be utilized, as all the solder connections 116 with a single group may or may not have the same offset. Additionally, although the offsets on opposite sides of the of the origin point are in opposite directions, all the directions of the offsets with a single group may or may not have the same offset direction. In one example, the direction of offsets within a single group 302, 304, 306 may vary about 90 degrees relative to the centerline 150, particularly if the offset with a group is radially aligned with the origin point. In another example, the direction of offsets within a single group 302, 304, 306 does not vary, and may be aligned in some groups in the plus X and minus X directions, and aligned in other groups in the plus Z and minus Z direction.

It is contemplated that additional interstitial groups of solder connections may reside between the third group 306 and either of the first or second groups 302, 304. The offset of the solder connections 116 within the interstitial groups may be greater than or equal to the offset of a group closer to the centerline 150, and less than or equal to the offset of a group farther from the centerline 150.

FIG. 4 is a schematic representation illustrating an exemplary distribution of relative alignment or shift (i.e., offset) between the exposed surfaces 218 of the solder pads 220 of the package substrate 104 and pillars 208 of the IC die 102 across different regions 302, 304, 306 of the chip package assembly 100. For simplicity, only one solder connection 116 comprising a mating pair of exposed surface 218 and pillar 208 is shown in each of the regions 302, 304, 306.

In solder connections 116 having offsets, the centerline 250 of the pillar 208 is positioned farther from the centerline 150 than the centerline 252 of the exposed surface 218 to accommodate for differences in the shrinkage between the IC die 102 and the package substrate 104. The difference in shrinkage between the IC die 102 and the package substrate 104 is driven by the materials and geometry of the structures comprising the die 102 and substrate 104, and is often corresponds to the differences in the coefficients thermal expansion (CTE). The IC die 102 typically has a CTE that is less than that of the package substrate 104. Thus, the package substrate 104 will shrink more than the IC die 102 after exposure to high temperature conditions, such as that experienced during reflow of the solder ball 214 during assembly of the IC die 102 to the package substrate 104. After expanding, the package substrate 104 does not quite return to its original size (i.e., shrinks), making the offset after reflow and shrinkage smaller, and thus imparting less stress on the solder resist 222. With less stress in the solder resist 222, the solder ball 214 is less susceptible to cracking, resulting in a substantially diminished probability of solder wicking and electrical shorting. Moreover, with less stress in the solder connection 116, the solder ball 214 is less susceptible to cracking or failure. Consequently, the offset results in a more robust and reliable solder joint, and accordingly, a more robust and reliable chip package assembly 100 and electronic device 120.

As illustrated in FIG. 4, the outsets defined between the centerline 252 of the exposed surface 218 and the centerline 250 of the pillar 208 in each of the corner (e.g., first) regions 302 are in directions away from the centerline 150 of the IC die 102. Thus, the offsets in opposite corners regions 302 are in the opposite directions.

Similarly, the outsets defined between the centerline 252 of the exposed surface 218 and the centerline 250 of the pillar 208 in each of the edge (e.g., second) regions 304 are in directions away from the centerline 150 of the IC die 102. Thus, the offsets in edge regions 304 disposed on opposite sides of the IC die 102 are in the opposite directions.

In the center (e.g., third) region 306, the centerline 252 of the exposed surface 218 and the centerline 250 of the pillar 208 are not offset. Stated differently, the centerlines 250, 252 in the center region 306 are collinear.

The centerline 252 may be offset from the centerline 250 utilizing a number of different techniques. In one example, the centerlines 252 of exposed surfaces 218 of the solder pads 220 may be shifted towards the centerline 150 (origin point) in at least the first regions 302 of the package substrate 104. The shifted centerlines 250 results in the pitch of the exposed surfaces 218 being less in the first region 302 proximate the corners of the IC die 102 relative to the pitch of centerlines 250 in the third (e.g., center) region 306 proximate the centerline 150 of the IC die 102 and origin point of the array of surfaces 218 exposed on the package substrate 104. The pitch in the first region 302 may be less than or equal to the pitch in the second region 304.

Similarly, the centerlines 252 of exposed surfaces 218 of the solder pads 220 in the second region 304 may be shifted towards the centerline 150 (origin point). The shifted centerlines 250 results in the pitch of the exposed surfaces 218 being less in the second region 304 between the corners regions 302 along the side 132 of the IC die 102 relative to the pitch of centerlines 250 in the third (e.g., center) region 306 proximate the centerline 150 of the IC die 102 and origin point of the array of surfaces 218 exposed on the package substrate 104. The pitch in the second region 304 may be greater than or equal to the pitch in the first region 302.

Although FIG. 4 was described with reference to the pitch between centerlines 252, 250, variation in the pitch between other structures comprising or associated with the solder connection 116 may also utilized to define the offset. Some of these structures include the openings 212, 216, the exposed surfaces 210, 218, the pillars 208 and the solder pads 220. When comparing pitch between centerlines 252, 250, openings 212, 216, exposed surfaces 210, 218, pillars 208 and/or solder pads 220, the average or representative pitch for each group may be utilized, as the pitch between structures with a single group may or may not be the same.

The distance to offset a particular solder connection 116 may be determined utilizing a variety of techniques. In one example, the offset distance may be expressed as a function of the distance from the origin/centerline 150 and the solder connection 116. The functional expression of the offset distance may be based on the differences in CTE between the IC die 102 and the package substrate 104. In another example, the offset distance for a particular location of the solder connection 116 may be determined empirically. It is contemplated that other methodologies may be utilized to determine the offset distance at any one of the solder connections 116.

Figure 5:
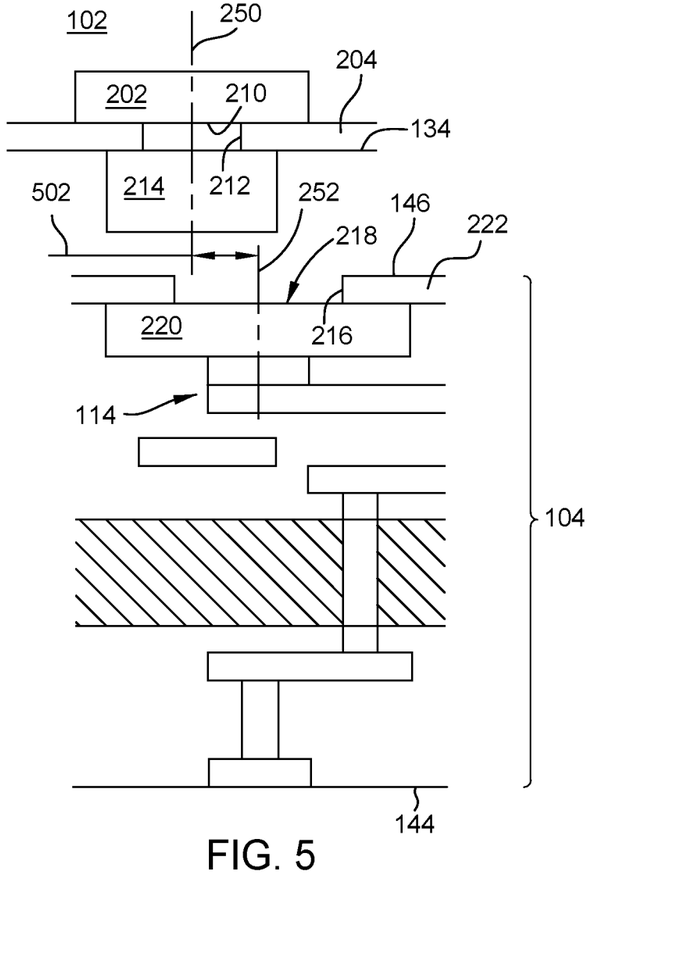
FIG. 5 is a partial sectional view of an exemplary solder connection disposed away from the center of the chip package assembly of FIG. 1 illustrating a shift between solder pads of the package substrate and bumps of the IC die.

FIG. 5 provides a partial sectional view of an exemplary solder connection 116 prior to reflow (and shrinkage) and without the solder ball (214 as shown in FIG. 2). After shrinkage, the offsets will remain, although less pronounced. The solder connection 116 is disposed away from the center of the chip package assembly 100, for example in either or both of regions 302, 304, illustrating a shift (e.g., offset 502) between centerlines 250, 252 of the exposed surfaces 210, 218 of the solder pads 220 of the package substrate 104 and the contact pad 202 of the IC die 102. In this example, the centerline 250 is also the centerline of the solder ball 214. Additionally in this example, the centerline 252 defined by the opening 216 in the solder resist 222 is also aligned (i.e., collinear) with the centerline of the solder pad 220.

Figure 6:
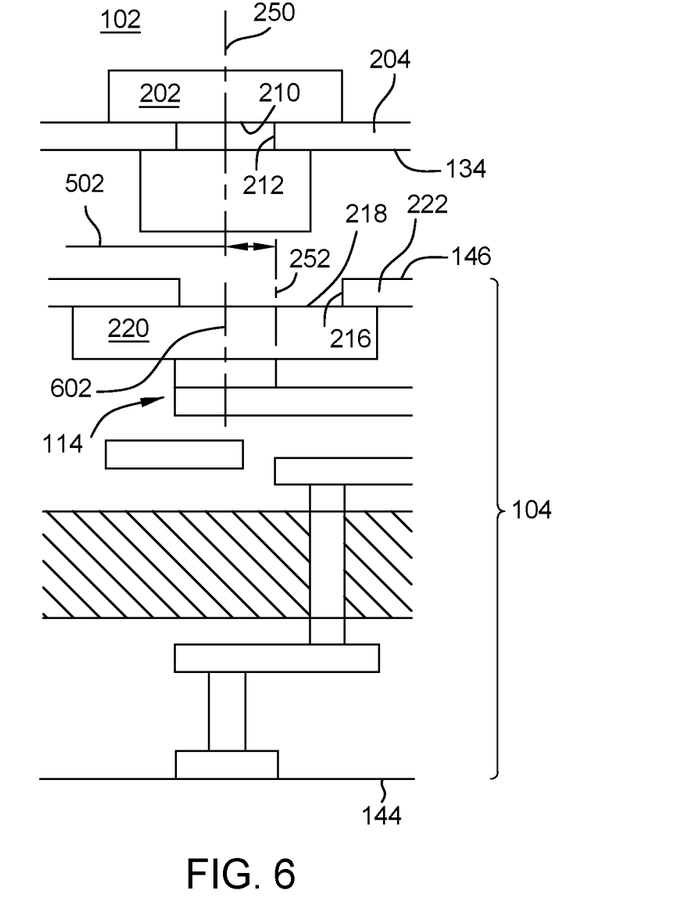
FIG. 6 is a partial sectional view of another exemplary solder connection illustrating a shift between solder pads of the package substrate and bumps of the IC die.

Alternatively, the offset between centerlines 250, 252 may be realized by offsetting the opening 216 in the solder resist 222 relative to the centerline of the solder pad 220. An example of an offset opening 216 in the solder resist 222 is illustrated in the partial sectional view of another exemplary solder connection 116 of FIG. 6. In FIG. 6, a shift (e.g., offset) 502 between centerlines 250, 252 of the exposed surfaces 210, 218 of the solder pads 220 of the package substrate 104 and the contact pad 202 of the IC die 102 is realized even though centerlines 250, 602 of the contact and solders pads 202, 220 remain coplanar. By shifting the opening 216 of the solder resist 222 laterally relative to the centerline 602 of the solder pad 220, the centerline 252 of the exposed surface 218 of the solder pad 220 is disposed a distance (i.e., offset 502) relative to the centerlines 250, 602. Thus in this example, the centerline 252 defined by the opening 216 in the solder resist 222 is offset from the centerline of the solder pad 220.

The offset 502 between centerlines 250, 252 in any of the examples described above may be realized through a variety of techniques. In one example, the offset 502 between centerlines 250, 252 is obtained by offsetting the exposed surface 218 of the solder pad 220 relative to the corresponding (i.e., mating) exposed surface 210 of the contact pads 202. In such an example, the pitch between the centerlines 252 of the exposed surface 218 of the solder pad 220 varies across the array of solder pads 220 as described above. With the smaller pitch in the corner regions, the resulting offset between centerlines 250, 252 in the corner regions 302 being larger than any offset present between centerlines 250, 252 proximate the center regions 306.

In another example, the offset 502 between centerlines 250, 252 is obtained by offsetting exposed surface 210 of the contact pads 202 relative to the corresponding (i.e., mating) the exposed surface 218 of the solder pad 220. In such an example, the pitch between the centerlines 250 of the exposed surface 210 of the contact pad 202 is greater near the side 132 of the IC die 102 as described above. With the smaller pitch in the corner regions, the resulting offset between centerlines 250, 252 in the corner regions 302 being larger than any offset present between centerlines 250, 252 proximate the center regions 306.

In yet another example, the offset 502 between centerlines 250, 252 is obtained by offsetting each of the exposed surfaces 210, 218 of the corresponding (i.e., mating) contact and solder pads 202, 220 in opposite directions relative to each other. In such an example, the pitch between the centerline 250 of the exposed surface 210 of the contact pad 202 is increased near the edge and/or corner regions, while the pitch between the centerline 252 of the exposed surface 218 of the solder pad 220 is decreased near the edge and/or corner regions. With the difference in pitches in the corner regions results in the offset between centerlines 250, 252 in the corner regions 302 being larger than any offset present between centerlines 250, 252 proximate the center regions 306.

In any of the examples described above, the resulting difference in pitch may be step-wise between at least two or more of the regions (302, 304, 306, etc.), decrease as a function of a distance from the IC die center, be a combination of the same, or in another manner.

Also as discussed above, any of the examples herein that employ offsetting centerlines 250, 252 of mating exposed surfaces 210, 218 in solder connections 116 may also have trenches formed in the solder resist 222 as described by example without limitation below with reference to FIGS. 7-10. Conversely, any of the examples described below with reference to FIGS. 7-10 may also be utilized with centerlines 250, 252 that are not offset.

Figure 7:
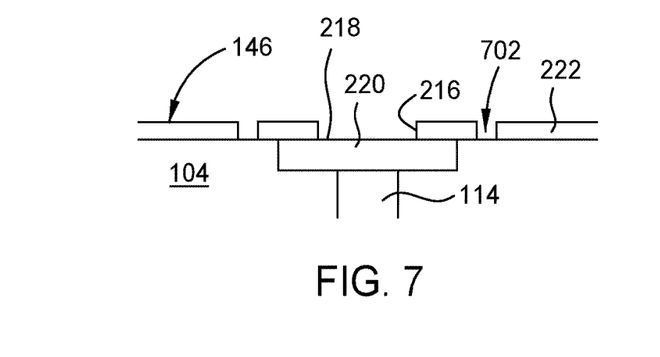
FIG. 7 is a partial sectional view of an exemplary package substrate illustrating a trench formed in a solder resist around a solder pad.

Thus, now turning to the partial sectional view of an exemplary package substrate 104 depicted in FIG. 7, a trench 702 encircling an exposed surface 218 of a solder pad 220 is formed in the solder resist 222. The trench 702 is generally outward of the solder pad 220 such that only dielectric material of the built-up layer of the package substrate 104 is exposed through the trench 702. Thus, should conductive material inadvertently enter the trench 702, the electrical connections made through the package substrate 104 is not compromised.

The trench 702 may extend partially or completely through the solder resist 222. The trench 702 creates a small ring of solder resist 222 immediately surrounding the solder pad or pads 220 that effectively isolates most if not all of the stress imparted the ring of solder resist 222 from the main bulk of solder resist 222 residing outward of the trench 702. The ring of solder resist 222 defined by the trench 702 is more resilient and flexible than the main bulk of solder resist 222, and thus has an increased resistance to cracking. Moreover, as the main bulk of solder resist 222 is isolated from the stress imparted by the solder pad 220, the main bulk of solder resist 222 essentially has a very probability of cracking. Regions susceptible to higher stress, such as proximate the corners and edges regions 302, 304 of the IC die 102, have trenches 702 that each circumscribe fewer solder pads 220, while regions susceptible to lower stress, such as the center region 306 proximate the centerline 150 of the IC die 102, may have no trenches or trenches 702 that each encircle a plurality of solder pads 220.

Figure 8:
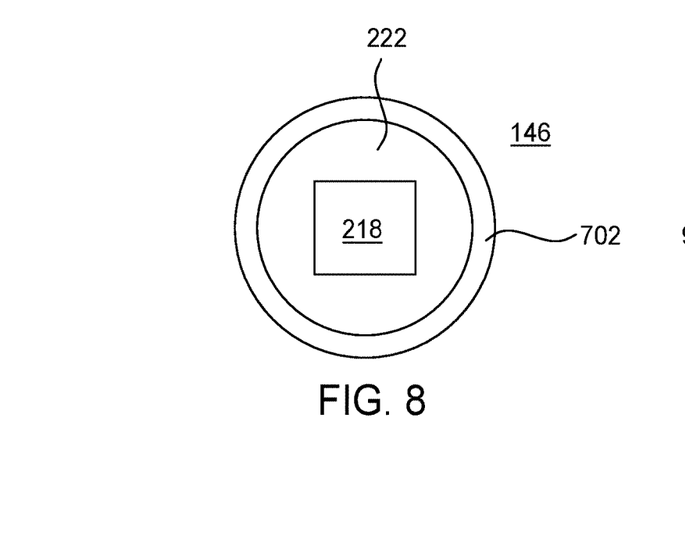
FIG. 8 is a partial top view of the solder pad illustrated in FIG. 7.
Figure 9:
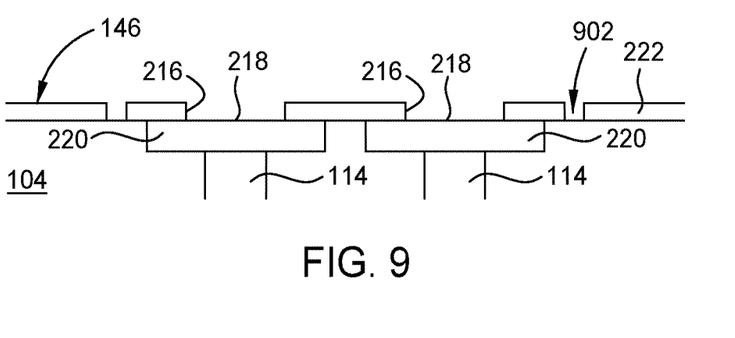
FIG. 9 is a partial sectional view of an exemplary package substrate illustrating a trench formed in a solder resist around a solder pad.
Figure 10:
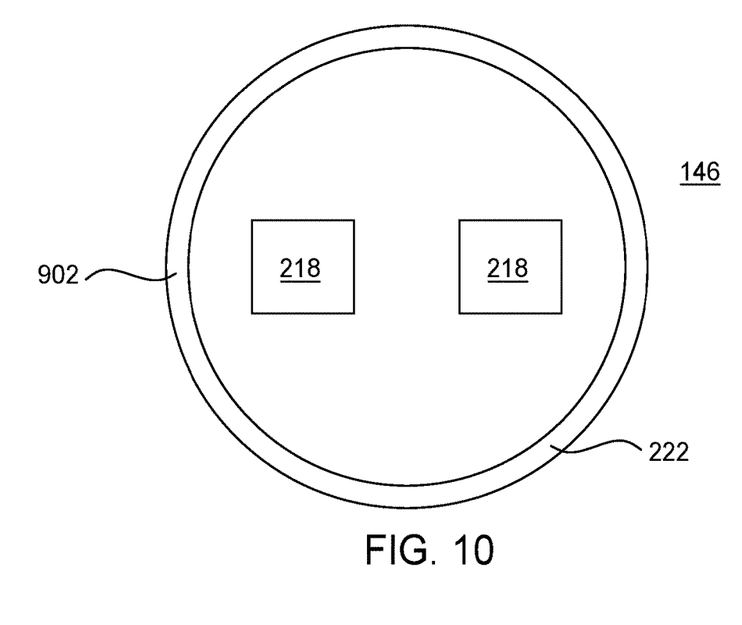
FIG. 10 is a partial top view of the solder pad illustrated in FIG. 9.

As additionally seen in FIG. 8, while the trench 702 surrounds the exposed surface 218, the solder resist 222 remains between the trench 702 and conductive material comprising the exposed surface 218 of the solder pad 220. Thus, the solder resist 222 between the trench 702 and the exposed surface 218 protects the solder pad 220 from inadvertent shorting and corrosion.

In the example depicted in FIGS. 7-8, only the exposed surface 218 of a single solder pad 220 is circumscribed by the trench 702. In the corner regions (such as the first regions 302 depicted in FIG. 3), a single trench 702 may circumscribes as few as one solder pad 220, while in a region closer to the center of the array of solder pads 220 (such as the third (e.g., center) region 306, a trench may not be utilized. Alternatively, a trench 902 may be utilized in the regions closer to the center of the array of solder pads 220 (i.e., further away from the corner regions) to circumscribe two or more solder pads 220 as illustrated in the partial sectional view of FIG. 9 and a corresponding top view of FIG. 10. For example, regions susceptible to higher stress, such as proximate the corners and edges regions 302, 304 of the IC die 102, trenches 702 may be formed in the solder resist 222 that each circumscribe fewer solder pads 220 compared to regions susceptible to lower stress, such as the center region 306 that is proximate the centerline 150 of the IC die 102. Such low stress regions may have trenches 902 that each encircle more than one solder pad 220. Beneficially, the trenches 702, 902 provide stress relief within the solder resist 222, particularly at solder pads 220 disposed near the corners of the IC die 102. Consequently, the trenches 702, 902 results in the solder resist 222 being much less prone to cracking. As noted above, the crack resistant solder resist 222 increases the reliability and performance of the solder connection 116, which also increases the reliability, performance and service life of the chip package assembly.

Accordingly, solder interconnects described herein reduces the probability of cracking of both the solder ball and solder resist after shrinkage, such as occurring during and after reflow. Consequently, less wicking of the solder ball results on more solder volume being retained within the solder ball, making a more robust and crack resistance electrical and mechanical connection. Additionally, less cracking of the solder resist additionally protects the solder ball, while also protecting the shorting of the traces within the package substrate. Accordingly, a more robust and reliable electrical connection is realized.

In addition to the claim recited below, additional examples of the disclosure may be recited as follows.

In a first example, a chip package assembly is provided that includes an integrated circuit (IC) die having a plurality of pillars; and a package substrate having a plurality of solder pads exposed through a solder resist, the solder pads coupled to the pillars of the IC die via solder connections, the solder resist having a first trench circumscribing a first solder pad of plurality of solder pads.

In the chip package assembly of the first example, the first trench is disposed below one of the corner regions of the IC die.

In the chip package assembly of the first example, the first trench is disposed around at least a second solder pad.

In the chip package assembly of the first example, the first trench is disposed below one of the corner regions of the IC die, while the solder resist further comprises a second trench formed in the solder resist and circumscribing at least one of the solder pads disposed in one of the center region of the IC die.

In a second example, a chip package assembly is provided that includes solder connections having greater offsets proximate the corner regions of an IC die relative to offsets proximate a centerline of the IC die.

In a third example, a chip package assembly is provided that includes exposed surfaces of one side of the solder connections proximate the corner regions of an IC die have pitch that is greater than a pitch of the exposed surfaces of the other side of the solder connections.

Other examples can be derived from the disclosure above, a portion of which are recited by the claims below.

While the foregoing is directed to embodiments of the present invention, other and further embodiments of the invention may be devised without departing from the basic scope thereof, and the scope thereof is determined by the claims that follow.

What is claimed is:

1. A chip package assembly comprising:
   an integrated circuit (IC) die having a plurality of pillars, each of the plurality of pillars having a centerline; and
   a package substrate having a plurality of solder pads, each of the plurality of solder pads having a pad surface exposed through a layer of solder resist, the exposed pad surface having a centerline, the solder pads arranged to connect to the pillars of the IC die via solder connections, wherein:
   a first offset defined between centerlines of a first pillar of the plurality of pillars disposed proximate a first edge of the IC die and a corresponding first exposed pad surface of a first solder pad of the plurality of solder pads is greater than a second offset defined between centerlines of a second pillar of the plurality of pillars disposed proximate a center of the IC die and a corresponding second exposed pad surface of a second solder pad of the plurality of solder pads; and
   a third offset defined between centerlines of a third pillar of the plurality of pillars disposed proximate a third edge of the IC die and a corresponding third exposed pad surface of a third solder pad of the plurality of solder pads is greater than the second offset.

2. The chip package assembly of claim 1, wherein a fourth offset defined between centerlines of a fourth pillar of the plurality of pillars disposed closer to a corner region of the IC die than the first pillar and a corresponding fourth exposed surface of a fourth solder pad of the plurality of solder pads is greater than the first offset.

3. The chip package assembly of claim 1, wherein an offset between pillars and corresponding exposed pad surfaces of the solder pads is proportional to a distance from the center of the IC die.

4. The chip package assembly of claim 1, wherein an offset between pillars and corresponding exposed pad surfaces of the solder pads is greatest at a corner region of the IC die.

5. The chip package assembly of claim 1, wherein a direction of the first offset is in a direction opposite of the third offset.

6. The chip package assembly of claim 1, wherein a pitch of exposed surfaces of the solder pads disposed on the substrate and arranged to connect with pillars disposed on the first edge and center of the IC die is substantially constant.

7. The chip package assembly of claim 1, wherein a pitch of the pillars exposed on the first edge and center of the IC die is substantially constant.

8. The chip package assembly of claim 1, wherein a pitch of the pillars and a pitch of the corresponding exposed surfaces of the solder pads both increase as a function to a distance from the center of the IC die.

9. The chip package assembly of claim 1, wherein a pitch of the pillars and a pitch of the corresponding solder pads disposed at proximate the center of the IC die are substantially equal.

10. The chip package assembly of claim 1, wherein the solder resist comprises:
    openings through which the exposed surfaces of the solder pads are exposed, wherein a first opening formed through the solder resist has a centerline that is offset relative to a centerline of the first solder pad, the centerline of solder resist being collinear with the centerline the first exposed surface of the first solder pad.

11. The chip package assembly of claim 1, wherein the solder resist further comprises:
    a first trench formed in the solder resist and disposed between the first exposed pad surface of the first solder pad and all neighboring solder pads of the package surface.

12. The chip package assembly of claim 1, wherein the solder resist further comprises:
    a first trench formed in the solder resist and circumscribing the first exposed pad surface of the first solder pad.

13. The chip package assembly of claim 12, wherein the solder resist further comprises:
    a second trench formed in the solder resist and circumscribing the second exposed pad surface of the second solder pad, the second trench circumscribing more solder pads than the first trench.

14. A chip package assembly comprising:
    an integrated circuit (IC) die having a plurality of pillars; and
    a package substrate having a plurality of solder pads configured to connect with the plurality of pillars, each solder pad and pillar comprising a corresponding pair, wherein a center of a solder pad disposed in a corner region of the IC die is disposed further from a centerline of the IC die than a center of the corresponding pillar.

15. The chip package assembly of claim 14, wherein an offset between a first solder pad and its corresponding pillar of a first corresponding pair is proportionally larger and an offset between a second solder pad and its corresponding pillar of a second corresponding pair relative to a distance from the centerline of the IC die of each of the first and second corresponding pair.

16. The chip package assembly of claim 14, wherein an offset between the solder pads configured to connect with the pillars disposed proximate to the centerline of the IC die is less that an offset between the pillars disposed in corner regions of the IC die and their corresponding the solder pads.

17. The chip package assembly of claim 14, wherein a pitch of exposed surfaces of the solder pads disposed on the substrate and arranged to connect with pillars disposed in the corner regions of the IC die is greater than a pitch of exposed surfaces of the solder pads disposed on the substrate and arranged to connect with pillars disposed proximate the centerline of the IC die.

18. The chip package assembly of claim 14, wherein the package substrate further comprises:
    a solder resist having opening through which a surface of the plurality of solder pads are exposed, wherein an opening through which the solder pad is coupled to one of the pillars disposed in one of the corner regions of the IC die is offset relative to a centerline of the solder pad.

19. The chip package assembly of claim 18, wherein the solder resist further comprises:
    a first trench formed in the solder resist and circumscribing one of the solder pads that configured to couple with one of the pillars disposed in one of the corner regions of the IC die.

20. The chip package assembly of claim 18, wherein the solder resist further comprises:
    a second trench formed in the solder resist and circumscribing at least one of the solder pads disposed in one of the center region of the IC die.

* * * * *